United States Patent
Seya

(10) Patent No.: US 9,177,823 B2
(45) Date of Patent: Nov. 3, 2015

(54) PLASMA ETCHING METHOD AND PLASMA ETCHING APPARATUS

(71) Applicant: TOKYO ELECTRON LIMITED, Tokyo (JP)

(72) Inventor: Yuta Seya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 64 days.

(21) Appl. No.: 14/073,996

(22) Filed: Nov. 7, 2013

(65) Prior Publication Data

US 2014/0134847 A1    May 15, 2014

Related U.S. Application Data

(60) Provisional application No. 61/727,194, filed on Nov. 16, 2012.

(30) Foreign Application Priority Data

Nov. 9, 2012   (JP) ................................. 2012-247781

(51) Int. Cl.
*H01L 21/302*    (2006.01)
*H01L 21/311*    (2006.01)
*H01L 21/3105*   (2006.01)

(52) U.S. Cl.
CPC ...... *H01L 21/31116* (2013.01); *H01L 21/3105* (2013.01); *H01L 21/31122* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| 2007/0026682 A1* | 2/2007 | Hochberg et al. ............. 438/710 |
| 2007/0165355 A1* | 7/2007 | Sato et al. ..................... 361/230 |
| 2011/0240599 A1 | 10/2011 | Honda |

FOREIGN PATENT DOCUMENTS

JP    2011-216644 A    10/2011

OTHER PUBLICATIONS

Morgan, The rf voltage/current characteristics and related dc negative bias properties of an Electrotech flat bed plasma etcher, 1981, Pergamon Press Ltd, vacuum vol. 32, No. 5, p. 297-303.*

* cited by examiner

*Primary Examiner* — Binh X Tran
*Assistant Examiner* — David Cathey, Jr.
(74) *Attorney, Agent, or Firm* — Rothwell, Figg, Ernst & Manbeck, P.C.

(57) ABSTRACT

A plasma etching method includes etching an amorphous carbon film by a plasma of an oxygen-containing gas using, as a mask, an SiON film having a predetermined pattern formed on a target object, etching a silicon oxide film by a plasma of a processing gas using the amorphous carbon film as a mask while removing the SiON film remaining on the etched amorphous carbon film by the plasma of the processing gas. The plasma etching method further includes modifying the amorphous carbon film by a plasma of a sulfur-containing gas or a hydrogen-containing gas while applying a negative DC voltage to an upper electrode containing silicon after the SiON film is removed from the amorphous carbon film, and etching the silicon oxide film again by the plasma of the processing gas using the modified amorphous carbon film as a mask.

14 Claims, 6 Drawing Sheets

FIG. 5

| | Post ME1 | Hardening | | W/O Hardening |
|---|---|---|---|---|
| | | COS/CF4/Ar Hardening | H2/Ar Hardening | |
| CROSS-SECTION | | | | |
| Top CD | 10.3nm | 10.3nm | 12.1nm | 13.7nm |
| UPPER SURFACE | | | | |
| LWR/SWR LER/Sum | 2.6/2.7/2.3/7.6 | 2.1/2.4/2.1/6.6 | 2.2/3.1/2.7/8.0 | 2.4/4.9/4.2/11.5 |

PLASMA ETCHING METHOD AND PLASMA ETCHING APPARATUS

CROSS-REFERENCE TO RELATED APPLICATION

This application claims priority to Japanese Patent Application No. 2012-247781, filed on Nov. 9, 2012 and U.S. Provisional Application No. 61/727,194, filed on Nov. 16, 2012, the entire contents of which are incorporated herein by reference.

FIELD OF THE INVENTION

Embodiments and aspects of the present invention relate to a plasma etching method and a plasma etching apparatus.

BACKGROUND OF THE INVENTION

Conventionally, a technique for etching a multilayer film formed on a target object has been known. For example, there is disclosed a technique of etching an amorphous carbon film by a plasma of a sulfur-containing gas using, as a mask, an SiON film having a predetermined pattern formed on the target object, and etching a silicon oxide film by a plasma of a CF-based gas using the amorphous carbon film as a mask (see, e.g., Japanese Patent Application Publication No. 2011-216644).

However, in the conventional technique, since the roughness of the amorphous carbon film due to etching is transferred to the underlying silicon oxide film, the lines formed by etching may be roughened, or the cross-sectional shape of the lines may be deteriorated.

For example, in the conventional technique, when etching a silicon oxide film without supplying a high frequency bias power, the cross-sectional shape of the lines formed by etching may be tapered. Meanwhile, in the conventional technique, when etching the silicon oxide film while supplying a high frequency bias power, wiggling of lines formed by etching may occur.

SUMMARY OF THE INVENTION

In accordance with an aspect of the present invention, there is provided a plasma etching method including: etching an amorphous carbon film by a plasma of an oxygen-containing gas using, as a mask, an SiON film having a predetermined pattern formed on a target object; etching a silicon oxide film by a plasma of a processing gas using the amorphous carbon film as a mask while removing the SiON film remaining on the etched amorphous carbon film by the plasma of the processing gas; modifying the amorphous carbon film by a plasma of a sulfur-containing gas or a hydrogen-containing gas while applying a negative DC voltage to an upper electrode containing silicon after the SiON film is removed from the amorphous carbon film; and etching the silicon oxide film by the plasma of the processing gas using the modified amorphous carbon film as a mask.

According to various aspects and embodiments of the present invention, a plasma etching apparatus and a plasma etching method capable of reducing the roughness of the lines formed by etching and improving the cross-sectional shape of the lines are realized.

BRIEF DESCRIPTION OF THE DRAWINGS

The objects and features of the present invention will become apparent from the following description of embodiments, given in conjunction with the accompanying drawings, in which:

FIG. 5 is a diagram showing the processing results in Comparative Example 1, Example 1 and Example 2.

DETAILED DESCRIPTION OF THE EMBODIMENTS

Figure 1:
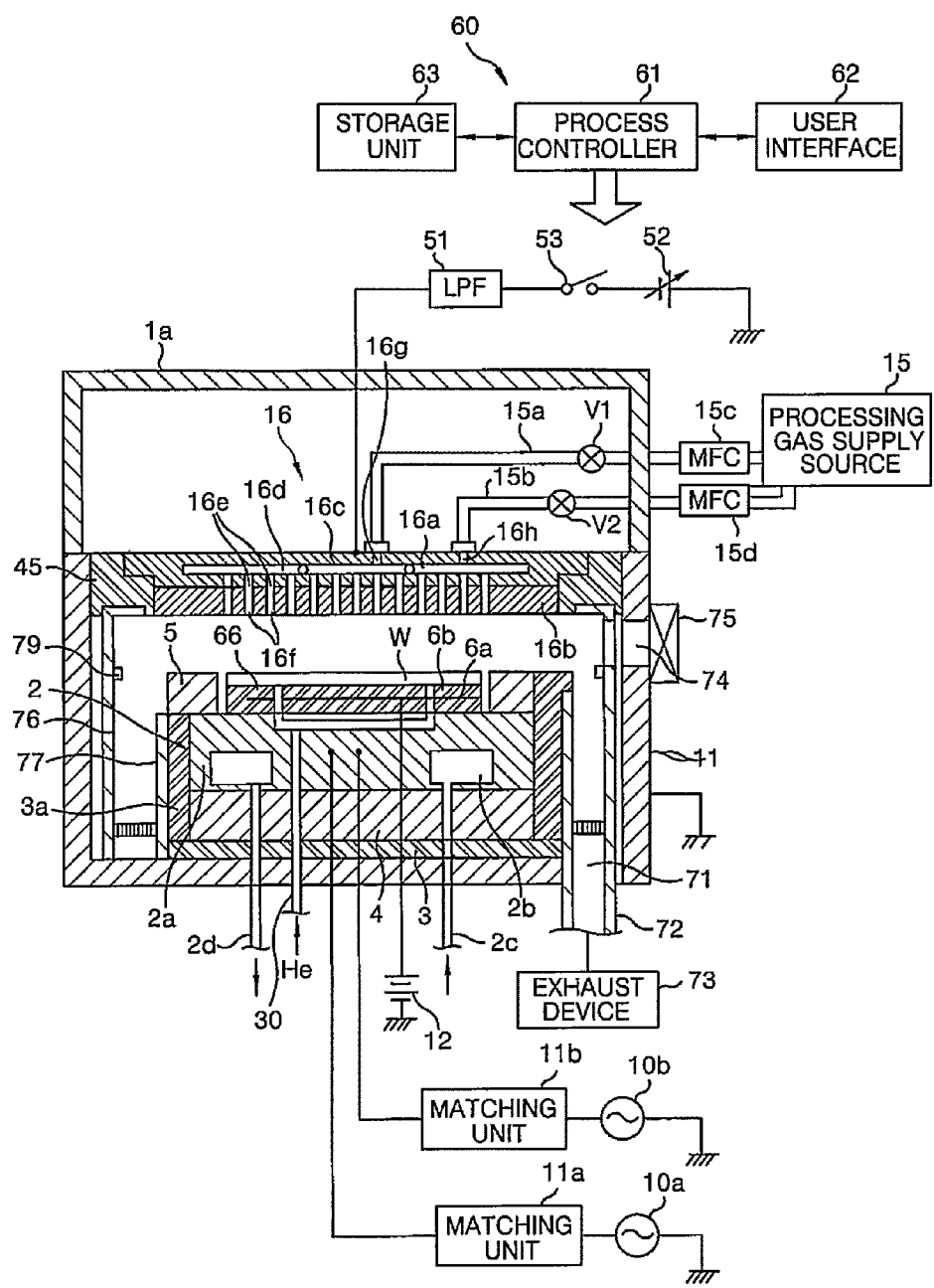
FIG. 1 is a schematic cross-sectional view showing a plasma etching apparatus that is applied to a plasma etching method according to an embodiment.

Hereinafter, embodiments of the present invention will be described in detail with reference to the accompanying drawings which form a part hereof. Throughout the specification and drawings, like reference numerals will be given to like parts having substantially the same function and configuration.

A plasma etching method according to the present embodiment includes, in one embodiment, an amorphous carbon film etching step of etching an amorphous carbon film by a plasma of an oxygen-containing gas using, as a mask, an SiON film having a predetermined pattern formed above a target object, a first silicon oxide film etching step of etching a silicon oxide film by a plasma of a processing gas using an amorphous carbon film as a mask while removing the SiON film remaining on the etched amorphous carbon film by a plasma of a processing gas, an amorphous carbon film modifying step of modifying an amorphous carbon film by a plasma of a sulfur-containing gas or hydrogen-containing gas while applying a negative DC voltage to an upper electrode including silicon after the SiON film is removed from the amorphous carbon film, and a second silicon oxide film etching step of etching a silicon oxide film by a plasma of a processing gas using the modified amorphous carbon film as a mask.

Further, in the plasma etching method according to the present embodiment, in one embodiment, the processing gas is a CF-based gas or a gaseous mixture of the CF-based gas and a CHF-based gas.

Further, in the plasma etching method according to the present embodiment, in one embodiment, the oxygen-containing gas is $O_2$ gas, a gaseous mixture of COS and $O_2$, or a gaseous mixture of CO and $O_2$.

Further, in the plasma etching method according to the present embodiment, in one embodiment, the CF-based gas is a gaseous mixture of $C_4F_6$, Ar and $O_2$ or a gaseous mixture of $C_4F_8$, Ar and $O_2$.

Further, in the plasma etching method according to the present embodiment, in one embodiment, the gaseous mixture of the CF-based gas and the CHF-based gas is a gaseous mixture of $C_4F_8$, $CHF_3$, Ar, and $O_2$, a gaseous mixture of $CF_4$, $CHF_3$, Ar, and $O_2$, or a gaseous mixture of $CF_4$, $CH_2F_2$, Ar, and $O_2$.

Further, in the plasma etching method according to the present embodiment, in one embodiment, the sulfur-containing gas is a gaseous mixture of COS, $CF_4$, and Ar, and the hydrogen-containing gas is a gaseous mixture of $H_2$ and Ar.

A plasma etching apparatus according to the present embodiment includes, in one embodiment, a processing chamber for performing a plasma etching process on the target object, a decompression unit for reducing the pressure in the processing chamber, a gas supply unit for supplying a processing gas into the processing chamber, and a control unit configured to perform each of the steps of etching an amorphous carbon film by a plasma of an oxygen-containing gas using, as a mask, an SiON film having a predetermined pattern formed above the target object, etching a silicon oxide film by a plasma of a processing gas using an amorphous carbon film as a mask while removing the SiON film remaining on the etched amorphous carbon film by the plasma of the processing gas, modifying an amorphous carbon film by a plasma of a sulfur-containing gas or hydrogen-containing gas while applying a negative DC voltage to an upper electrode containing silicon after the SiON film is removed from the amorphous carbon film, and etching a silicon oxide film by a plasma of a processing gas using the modified amorphous carbon film as a mask.

FIG. 1 is a schematic cross-sectional view showing a plasma etching apparatus that is applied to a plasma etching method according to the embodiment. The plasma etching apparatus shown in FIG. 1 includes a processing chamber 1 which is airtightly sealed and electrically grounded. The processing chamber 1 has a cylindrical shape, and is made of, for example, aluminum whose surface is anodically oxidized or the like. A mounting table 2 is provided in the processing chamber 1 to horizontally support a semiconductor wafer W that is a target object.

The mounting table 2 functions as a lower electrode, and a base 2a of the mounting table 2 is made of conductive metal, for example, aluminum or the like. The mounting table 2 is supported by a conductive support 4 via an insulating plate 3. Further, a focus ring 5 made of, for example, single crystalline silicon is provided at the outer periphery on the mounting table 2. Further, a cylindrical inner wall member 3a made of, e.g., quartz or the like is provided to surround the mounting table 2 and the support 4.

The base 2a of the mounting table 2 is connected to a first high frequency power supply 10a via a first matching unit 11a, and also connected to a second high frequency power supply 10b via a second matching unit 11b. The first high frequency power supply 10a is provided for plasma generation, and a high frequency power of a predetermined frequency (e.g., 60 MHz) is supplied from the first high frequency power supply 10a to the base 2a of the mounting table 2. Further, the second high frequency power supply 10b is provided for ion attraction (bias), and a high frequency power of a predetermined frequency (e.g., 400 kHz) lower than that of the first high frequency power supply 10a is supplied from the second high frequency power supply 10b to the base 2a of the mounting table 2. On the other hand, above the mounting table 2, a shower head 16 functioning as an upper electrode is provided to face in parallel with the mounting table 2. The shower head 16 and the mounting table function as a pair of electrodes (upper and lower electrodes).

On the upper surface of the mounting table 2, an electrostatic chuck 6 for electrostatically attracting and holding the semiconductor wafer W is provided. The electrostatic chuck 6 is constituted by interposing an electrode 6a between insulators 6b, and a DC power supply 12 is connected to the electrode 6a. The electrostatic chuck 6 is configured such that the semiconductor wafer W is attracted and held by a Coulomb force by applying a DC voltage from the DC power supply 12 to the electrode 6a.

Inside the mounting table 2, a coolant flow path 2b is formed, and the coolant flow path 2b communicates with a coolant inlet pipe 2c and a coolant outlet pipe 2d. Then, by circulating a coolant such as Galden in the coolant flow path 2b, the support 4 and the mounting table 2 can be controlled to a predetermined temperature. Further, a backside gas supply pipe 30 for supplying a cold heat transfer gas (backside gas) such as helium gas to the backside of the semiconductor wafer W is provided so as to pass through the mounting table 2 and the like. The backside gas supply pipe 30 is connected to a backside gas supply source (not shown). By these configurations, the semiconductor wafer W attracted and held on the upper surface of the mounting table 2 by the electrostatic chuck 6 can be controlled to a predetermined temperature.

The shower head 16 is provided in a top wall of the processing chamber 1. The shower head 16 includes a main body 16a and an upper ceiling plate 16b forming an electrode plate. The shower head 16 is supported at the top of the processing chamber 1 through an insulating member 45. The main body 16a is made of a conductive material, for example, aluminum whose surface is anodically oxidized. The main body 16a is configured to detachably hold the upper top plate 16b thereunder. The upper top plate 16b is formed of a silicon-containing material, for example, silicon.

Inside the main body 16a, gas diffusion spaces 16c and 16d are provided. A plurality of gas flow holes 16e are formed at a lower portion of the main body 16a and positioned under the gas diffusion spaces 16c and 16d. A gas diffusion space is divided into two parts of the gas diffusion space 16c provided in a central portion and the gas diffusion space 16d provided in a peripheral portion. Thus, it is possible to independently change the supply state of the processing gas to the center portion and the peripheral portion.

Further, gas inlet holes 16f are provided in the upper top plate 16b to extend through the upper top plate 16b in the thickness direction and communicate with the respective gas flow holes 16e. By this configuration, the processing gas supplied to the gas diffusion spaces 16c and 16d is supplied to be dispersed like a shower into the processing chamber 1 through the gas flow holes 16e and the gas inlet holes 16f. In addition, piping (not shown) for circulating a coolant is provided in the main body 16a or the like, so that the temperature of the shower head 16 can be controlled to a desired temperature in the plasma etching process.

In the main body 16a, two gas inlet ports 16g and 16h for introducing a processing gas in the gas diffusion spaces 16c and 16d are formed. One end of each of the gas supply pipes 15a and 15b are connected to each of the gas inlet ports 16g and 16h. A processing gas supply source 15 for supplying a processing gas for etching is connected to the other end of each of the gas supply pipes 15a and 15b. The processing gas supply source 15 is an example of a gas supply unit. In the gas supply pipe 15a, a mass flow controller (MFC) 15c and an opening/closing valve V1 are provided in this order from the upstream side. Further, in the gas supply pipe 15b, a mass flow controller (MFC) 15d and an opening/closing valve V2 are provided in this order from the upstream side.

A processing gas for plasma etching is supplied from the processing gas supply source 15 to the gas diffusion spaces 16c and 16d through the gas supply pipes 15a and 15b. Then, the processing gas is supplied from the gas diffusion spaces 16c and 16d to be dispersed like a shower into the processing chamber 1 through the gas flow holes 16e and the gas inlet holes 16f. For example, as will be described later, an oxygen-containing gas used for etching the amorphous carbon film, a processing gas used for etching the silicon oxide film and the like are supplied from the processing gas supply source 15. Further, for example, a sulfur-containing gas or hydrogen-containing gas used for modifying the amorphous carbon film is supplied from the processing gas supply source 15. The details of the gases supplied by the processing gas supply source 15 will be described later.

A variable DC power supply 52 is electrically connected to the shower head 16 serving as the upper electrode via a low pass filter (LPF) 51. The power supply of the variable DC power supply 52 can be controlled by on and off of an on-off switch 53. The current and voltage of the variable DC power supply 52 and the on-off of the on-off switch 53 are controlled by a control unit 60 which will be described later. Further, as will be described later, when a plasma is generated in the processing space by applying a high frequency power to the mounting table 2 from the first high frequency power supply 10a and the second high frequency power supply 10b, the on-off switch 53 is turned on by the control unit 60 as necessary, and a predetermined DC voltage is applied to the shower head 16 serving as the upper electrode.

A cylindrical ground conductor 1a is provided so as to extend upward above the height of the shower head 16 from a sidewall of the processing chamber 1. The cylindrical ground conductor 1a has a ceiling wall at the top.

An exhaust port 71 is formed at the bottom portion of the processing chamber 1. An exhaust device 73 is connected to the exhaust port 71 through an exhaust pipe 72. The exhaust device 73 includes a vacuum pump, so that the processing chamber 1 can be depressurized to a predetermined vacuum level by operating the vacuum pump. The exhaust device 73 is an example of the decompression unit. Meanwhile, a loading/unloading port 74 of the semiconductor wafer W is provided at the sidewall of the processing chamber 1. In the loading/unloading port 74, a gate valve 75 for opening and closing the loading/unloading port 74 is provided.

In FIG. 1, each of reference numerals 76 and 77 denotes a deposition shield which is detachable. The deposition shield 76 is provided along the inner wall of the processing chamber 1, and serves to prevent etching by-products (deposition) from being attached to the processing chamber 1. At a height position substantially the same as the semiconductor wafer W of the deposition shield 76, a conductive member (GND block) 79 which is DC-connected to the ground is provided to thereby prevent abnormal discharge.

The overall operation of the plasma etching apparatus having the above-described configuration is controlled by the control unit 60. The control unit 60 includes a process controller 61 having a CPU to control each unit of the plasma etching apparatus, and a user interface 62 and a storage unit 63.

The user interface 62 includes a keyboard through which an operator performs an input operation of commands to manage the plasma etching apparatus, a display for visually displaying an operational status of the plasma etching apparatus and the like.

The storage unit 63 stores a control program (software) for implementing various processes executed by the plasma etching apparatus under control of the process controller 61, or a recipe in which processing condition data and the like have been stored. Then, if necessary, a desired recipe is retrieved from the storage unit 63 in accordance with instructions from the user interface 62 to be executed by the process controller 61. Accordingly, a desired process is performed in the plasma etching apparatus under the control of the process controller 61. Further, the control program and recipe such as processing condition data may be stored in a computer readable recording medium (e.g., hard disk, CD, flexible disk, semiconductor memory, etc.), or may be transmitted on line at any time from another device via, e.g., a dedicated line.

For example, the control unit 60 controls each unit of the plasma etching apparatus to perform the plasma etching method that will be described later. As a detailed example, the control unit 60 etches the amorphous carbon film by the plasma of the first sulfur gas using, as a mask, the SiON film having a predetermined pattern formed on the target object. Then, the control unit 60 etches the silicon oxide film by the plasma of the processing gas using the amorphous carbon film as a mask while removing the SiON film remaining on the etched amorphous carbon film by the plasma of the processing gas. Then, after the SiON film is removed from the amorphous carbon film, the control unit 60 modifies the amorphous carbon film by the plasma of the sulfur-containing gas or hydrogen-containing gas while applying a negative DC voltage to the shower head 16 serving as the upper electrode. Then, the control unit 60 etches the silicon oxide film by the plasma of the processing gas using the modified amorphous carbon film as a mask. The plasma etching method will be described in detail later. In this case, the target object is, for example, the semiconductor wafer W. Further, the silicon oxide film is, for example, a $SiO_2$ film.

Figure 2:
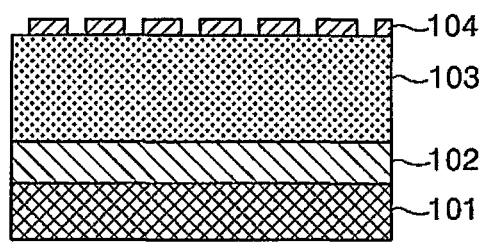
FIG. 2 is a cross-sectional view illustrating a structural example of a target object in the present embodiment.

FIG. 2 is a cross-sectional view illustrating a structural example of the target object in the present embodiment. The target object has a Si substrate 101, a $SiO_2$ film 102 formed on the Si substrate 101, and an amorphous carbon film 103 formed on the $SiO_2$ film 102. A SiON film 104 having a predetermined pattern is formed on the amorphous carbon film 103.

Next, there will be described a plasma processing procedure of the semiconductor wafer W in the plasma etching apparatus having the above configuration. First, the gate valve 75 is opened, and the semiconductor wafer W is loaded into the processing chamber 1 through the loading/unloading port 74 from a load-lock chamber (not shown) by a transfer robot (not shown) or the like and mounted on the mounting table 2. Thereafter, the transfer robot is retracted outside the processing chamber 1, and the gate valve 75 is closed. Then, the processing chamber 1 is evacuated through the exhaust port 71 by the vacuum pump of the exhaust device 73.

After the processing chamber 1 is evacuated to a predetermined vacuum level, a predetermined processing gas (etching gas) is introduced into the processing chamber 1 from the processing gas supply source 15, and the processing chamber 1 is maintained at a predetermined pressure. In this case, the supply state of the processing gas from the processing gas supply source 15 may be made different between the central portion and the peripheral portion. Further, in the total supply amount of the processing gas, a ratio of the supply amount in the central portion to the supply amount in the peripheral portion can be controlled to a desired value.

Then, in this state, a high frequency power having a frequency of, e.g., 60 MHz is supplied from the first high frequency power supply 10a to the base 2a of the mounting table 2. In addition, for the ion attraction, a high frequency power (for bias) having a frequency of, e.g., 400 kHz is supplied from the second high frequency power supply 10b to the base 2a of the mounting table 2. In this state, a predetermined DC voltage is applied to the electrode 6a of the electrostatic chuck 6 from the DC power supply 12, and the semiconductor wafer W is attracted and held on the electrostatic chuck 6 by a Coulomb force.

The high frequency power is applied to the mounting table 2 serving as the lower electrode as described above. Accordingly, an electric field is formed between the shower head 16 serving as the upper electrode and the mounting table 2 serving as the lower electrode. By this electric field, discharge is generated to form a plasma in the processing space in which the semiconductor wafer W is present. By the plasma of the processing gas thus formed, a plasma process (an etching process, a modification process of a photoresist film or the like) is performed on the semiconductor wafer W.

Further, as described above, since a DC voltage can be applied to the shower head 16 during plasma processing, the following effects can be obtained. That is, depending on the process, a plasma having high electron density and low ion energy may be required. By using a DC voltage in such a case, the electron density of the plasma is increased while suppressing ion energy that is focused on the semiconductor wafer W. Accordingly, an etching rate of an etching target film of the semiconductor wafer W increases, and a sputtering rate of a film serving as a mask provided on the etching target film decreases. Therefore, selectivity is improved.

Then, upon completion of the plasma process, the supply of the high frequency power, the supply of the DC voltage and the supply of the processing gas are stopped, the semiconductor wafer W is unloaded from the processing chamber 1 in the reverse sequence to the above-described sequence.

Figure 3:
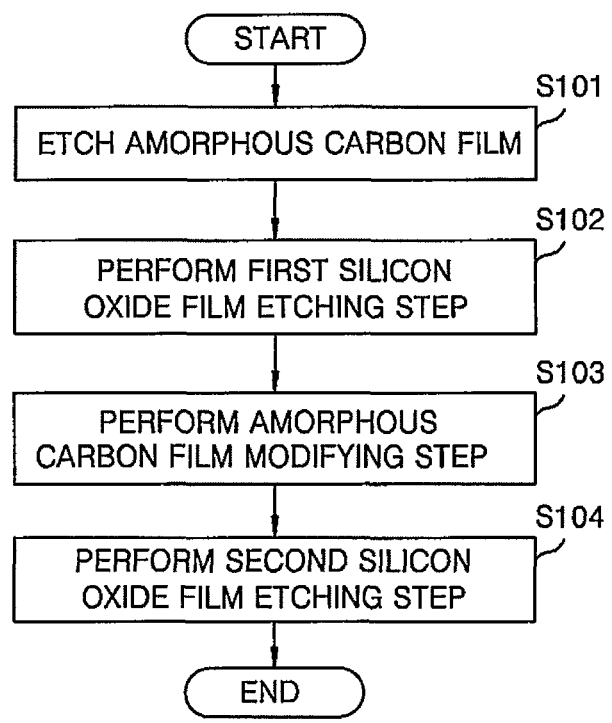
FIG. 3 is a flowchart showing an example of a process flow of a plasma etching method using the plasma etching apparatus according to the present embodiment.

Next, the plasma etching method using the plasma etching apparatus according to the present embodiment will be described in more detail. FIG. 3 is a flowchart showing an example of a process of the plasma etching method using the plasma etching apparatus according to the present embodiment. FIGS. 4A to 4E are explanatory diagrams for explaining an example of a process of the plasma etching method using the plasma etching apparatus according to the present embodiment. In this case, there will be described an example of plasma etching the $SiO_2$ film 102 included in the target object shown in FIG. 2 by the plasma etching apparatus.

Figure 4A:
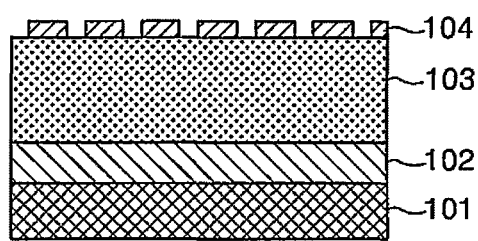
FIGS. 4A to 4E are explanatory diagrams for explaining an example of a process flow of the plasma etching method using the plasma etching apparatus according to the present embodiment.
Figure 4B:
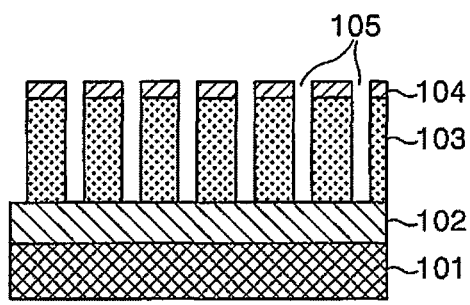

As shown in FIG. 3, the plasma etching apparatus performs an amorphous carbon film etching step of etching the amorphous carbon film 103 by the plasma of the oxygen-containing gas using the SiON film 104 having a predetermined pattern as a mask (step S101). Specifically, the control unit 60 reduces the pressure in the processing chamber 1 through the exhaust port 71 by the vacuum pump of the exhaust device 73, supplies the oxygen-containing gas from the processing gas supply source 15 into the processing chamber 1, and etches the amorphous carbon film 103 by the plasma of the oxygen-containing gas. Thus, as shown in FIG. 4B, the amorphous carbon film 103 is etched using the SiON film 104 as a mask, and openings 105 are formed to expose the $SiO_2$ film 102. Further, FIG. 4A shows the target object, and is identical to the structural example of FIG. 2. In this case, the oxygen-containing gas is $O_2$ gas, a gaseous mixture of COS and $O_2$, or a gaseous mixture of CO and $O_2$, for example.

A description will be given using a more detailed example. In the plasma etching apparatus, the target object is mounted on the electrostatic chuck 6. Thereafter, the control unit 60 introduces the oxygen-containing gas into the processing chamber 1 from the shower head 16, and generates a plasma from the oxygen-containing gas by applying a high frequency power for plasma generation into the processing chamber 1 from the first high frequency power supply 10a.

Figure 4C:
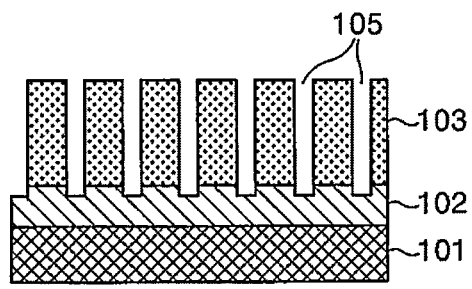

Subsequently, the plasma etching apparatus performs a first silicon oxide film etching step of etching the $SiO_2$ film 102 by the plasma of the processing gas using the amorphous carbon film 103 as a mask while removing the remaining SiON film 104 by the plasma of the processing gas (step S102). Specifically, the control unit 60 supplies the processing gas into the processing chamber 1 from the processing gas supply source 15, and etches the $SiO_2$ film 102 while removing the SiON film 104 by the plasma of the processing gas. Accordingly, as shown in FIG. 4C, the SiON film 104, which remains in the form of blocking the openings 105 while remaining on the amorphous carbon film 103, is removed. Further, as shown in FIG. 4C, portions of the $SiO_2$ film 102 corresponding to the openings 105 are etched in a recessed shape. In this case, the processing gas is, for example, a CF-based gas or a gaseous mixture of the CF-based gas and a CHF-based gas. Preferably, the CF-based gas is a gaseous mixture of $C_4F_6$, Ar and $O_2$ or a gaseous mixture of $C_4F_8$, Ar and $O_2$. The gaseous mixture of the CF-based gas and the CHF-based gas is a gaseous mixture of $C_4F_8$, $CHF_3$, Ar, and $O_2$, a gaseous mixture of $CF_4$, $CHF_3$, Ar, and $O_2$, or a gaseous mixture of $CF_4$, $CH_2F_2$, Ar, and $O_2$.

A description will be given using a more detailed example. In the plasma etching apparatus, the control unit 60 introduces the processing gas containing the CF-based gas or the gaseous mixture of the CF-based gas and the CHF-based gas into the processing chamber 1 from the shower head 16, and generates a plasma from the processing gas by applying a high frequency power for plasma generation into the processing chamber 1 from the first high frequency power supply 10a while applying a predetermined DC voltage to the shower head 16 from the variable DC power supply 52. Further, the control unit 60 applies a high frequency power for ion attraction to the electrostatic chuck 6 from the second high frequency power supply 10b to attract ions in the plasma toward the semiconductor wafer W. Further, the control unit 60 continues the process until the SiON film 104 which remains in the form of blocking the openings 105 while remaining on the amorphous carbon film 103 is removed, and portions of the $SiO_2$ film 102 corresponding to the openings 105 are etched in a recessed shape.

Figure 4D:
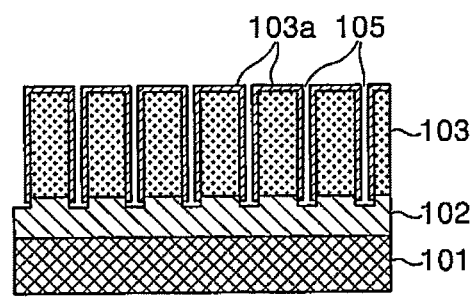

Subsequently, the plasma etching apparatus performs an amorphous carbon film modifying step of modifying the amorphous carbon film 103 by the plasma of the sulfur-containing gas or hydrogen-containing gas while applying a negative DC voltage to the upper electrode containing silicon after removing the SiON film 104 (step S103). Specifically, the control unit 60 supplies the sulfur-containing gas or hydrogen-containing gas into the processing chamber 1 from the processing gas supply source 15, and modifies the amorphous carbon film 103 by the plasma of the sulfur-containing gas or hydrogen-containing gas while applying a negative DC voltage to the shower head 16 serving as the upper electrode containing silicon. Accordingly, as shown in FIG. 4D, a modified film 103a containing a CS-based material or Si-containing material is formed on the surface of the amorphous carbon film 103. A film formation example of the modified film 103a will be described later. In this case, the sulfur-containing gas is a gaseous mixture of COS, $CF_4$, and Ar, and the hydrogen-containing gas is a gaseous mixture of $H_2$ and Ar.

A description will be given using a more detailed example. In the plasma etching apparatus, the control unit introduces the sulfur-containing gas or hydrogen-containing gas into the processing chamber 1 from the shower head 16, and generates a plasma from the sulfur-containing gas or hydrogen-containing gas by applying a high frequency power for plasma generation into the processing chamber 1 from the first high frequency power supply 10a while applying a negative DC voltage to the shower head 16 from the variable DC power supply 52.

A film formation example of the modified film 103a will be described in more detail. First, Film Formation Example 1 of the modified film 103a will be described. In Film Formation Example 1, it is assumed that the amorphous carbon film 103 is modified by the plasma of the sulfur-containing gas to form the modified film 103a. When a negative DC voltage is applied to the shower head 16 containing silicon, ion collision to the surface of the upper top plate 16b as the surface of the shower head 16 is accelerated, and the sputtering amount of silicon contained in the shower head 16 increases. For example, argon ions collide with the surface of the upper top plate 16b of the shower head 16, and silicon contained in the shower head 16 sputtered toward the amorphous carbon film 103. The silicon sputtered toward the amorphous carbon film 103 is bonded with fluorine in the plasma. Then, the carbon and sulfur in the plasma are bonded, and the CS-based material can be obtained. The CS-based material is deposited as the modified film 103a on the surface of the amorphous carbon film 103. As a result, the surface roughness of the amorphous carbon film 103 is improved and the plasma resistance of the surface of the amorphous carbon film 103 is improved.

Then, Film Formation Example 2 of the modified film 103a will be described. In Film Formation Example 2, it is assumed that the amorphous carbon film 103 is modified by the plasma of the hydrogen-containing gas to form the modified film 103a. When a negative DC voltage is applied to the shower head 16 containing silicon, ion collision to the surface of the upper top plate 16b as the surface of the shower head 16 is accelerated, and the sputtering amount of silicon contained in the shower head 16 increases. For example, argon ions collide with the surface of the upper top plate 16b of the shower head 16, and silicon contained in the shower head 16 is sputtered toward the amorphous carbon film 103. Then, the silicon-containing material is deposited as the modified film 103a on the surface of the amorphous carbon film 103. As a result, the surface roughness of the amorphous carbon film 103 is improved and the plasma resistance of the surface of the amorphous carbon film 103 is improved.

Figure 4E:
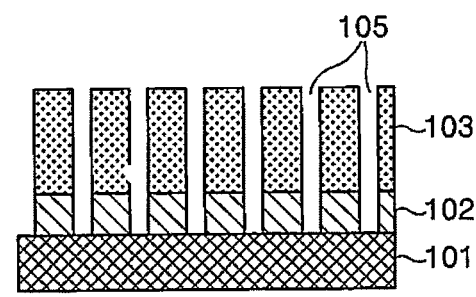

Referring back to FIG. 3, subsequently, the plasma etching apparatus performs a second silicon oxide film etching step of etching the $SiO_2$ film 102 by the plasma of the processing gas using the modified amorphous carbon film 103 as a mask (step S104). Specifically, the control unit 60 supplies the processing gas into the processing chamber 1 from the processing gas supply source 15, and etches the $SiO_2$ film 102 by the plasma of the processing gas. Accordingly, as shown in FIG. 4E, portions of the $SiO_2$ film 102 corresponding to the openings 105 are etched to expose the Si substrate 101 through the openings 105. In this case, the processing gas is, for example, a CF-based gas or a gaseous mixture of the CF-based gas and a CHF-based gas. Preferably, the CF-based gas is a gaseous mixture of $C_4F_6$, Ar and $O_2$ or a gaseous mixture of $C_4F_8$, Ar and $O_2$. Preferably, the gaseous mixture of the CF-based gas and the CHF-based gas is a gaseous mixture of $C_4F_8$, $CHF_3$, Ar, and $O_2$, a gaseous mixture of $CF_4$, $CHF_3$, Ar, and $O_2$, or a gaseous mixture of $CF_4$, $CH_2F_2$, Ar, and $O_2$.

A description will be given using a more detailed example. In the plasma etching apparatus, the control unit 60 introduces the processing gas containing the CF-based gas or the gaseous mixture of the CF-based gas and the CHF-based gas into the processing chamber 1 from the shower head 16, and generates a plasma from the processing gas by applying a high frequency power for plasma generation into the processing chamber 1 from the first high frequency power supply 10a while applying a predetermined DC voltage to the shower head 16 from the variable DC power supply 52. Further, the control unit 60 applies a high frequency power for ion attraction to the electrostatic chuck 6 from the second high frequency power supply 10b to attract ions in the plasma toward the semiconductor wafer W. Further, the control unit 60 continues the process until portions of the $SiO_2$ film 102 corresponding to the openings 105 are etched to expose the Si substrate 101 through the openings 105.

As described above, according to the present embodiment, the amorphous carbon film etching step is performed such that the amorphous carbon film is etched by the plasma of the first sulfur gas using, as a mask, the SiON film having a predetermined pattern formed on the target object. Then, according to the present embodiment, the first silicon oxide film etching step is performed such that the silicon oxide film is etched by the plasma of the processing gas using the amorphous carbon film as a mask while removing the SiON film remaining on the etched amorphous carbon film by the plasma of the processing gas. Then, according to the present embodiment, the amorphous carbon film modifying step is performed such that the amorphous carbon film is modified by the plasma of the sulfur-containing gas or hydrogen-containing gas while applying a negative DC voltage to the shower head 16 serving as the upper electrode after the SiON film is removed from the amorphous carbon film. Then, according to the present embodiment, the second silicon oxide film etching step is performed such that the silicon oxide film is etched by the plasma of the processing gas using the modified amorphous carbon film as a mask. Therefore, according to the present embodiment, as compared with a method that does not include the amorphous carbon film modifying step, it is possible to improve the surface roughness of the amorphous carbon film 103 while improving the plasma resistance of the surface of the amorphous carbon film 103. In other words, it is possible to suppress the roughness of the amorphous carbon film 103 from being transferred to the underlying silicon oxide film during etching. As a result, according to the present embodiment, it is possible to reduce the roughness of lines formed by etching to improve a cross-sectional shape of the lines.

Further, according to the present embodiment, since the amorphous carbon film serving as a mask is modified before etching the underlying silicon oxide film, it is possible to improve the hardness of the mask by modification and suppress wiggling of the lines.

Further, according to the present embodiment, the sulfur-containing gas is the gaseous mixture of COS, $CF_4$, and Ar, and the hydrogen-containing gas is the gaseous mixture of $H_2$ and Ar. As a result, according to the present embodiment, the CS-based material or silicon-containing material may be deposited efficiently as the modified film 103a on the surface of the amorphous carbon film serving as a mask.

Hereinafter, the plasma etching method of the present embodiment will be described in more detail using examples. However, the plasma etching method of the present embodiment is not limited to the following examples.

Comparative Example 1

In Comparative Example 1, an amorphous carbon film etching step of etching an amorphous carbon film on a target object, a first silicon oxide film etching step of etching a silicon oxide film, and a second silicon oxide film etching step of etching the silicon oxide film were sequentially performed. The amorphous carbon film etching step, the first silicon oxide film etching step and the second silicon oxide film etching step were carried out under the following conditions, respectively.

(Amorphous Carbon Film Etching Step)
Processing gas flow ratio: $COS/O_2=15:345$
Pressure: 1.3 Pa (10 mTorr)
High frequency power from the first high frequency power supply: 1200 W
High frequency power from the second high frequency power supply: 0 W
DC voltage to the upper electrode: 0 V
(First Silicon Oxide Film Etching Step)

Processing gas flow ratio: $C_4F_8/CHF_3$:Ar:$O_2$=15:30:150:16

Pressure: 2.6 Pa (20 mTorr)

High frequency power from the first high frequency power supply: 900 W

High frequency power from the second high frequency power supply: 350 W

DC voltage to the upper electrode: −300 V (Second Silicon Oxide Film Etching Step)

Processing gas flow ratio: $C_4F_8/CHF_3$:Ar:$O_2$=15:30:150:25

Pressure: 2.6 Pa (20 mTorr)

High frequency power from the first high frequency power supply: 900 W

High frequency power from the second high frequency power supply: 1400 W

DC voltage to the upper electrode: −300 V

Example 1

In Example 1, after an amorphous carbon film etching step and a first silicon oxide film etching step were sequentially performed on a target object, an amorphous carbon film modifying step of modifying an amorphous carbon film was performed, and then, a second silicon oxide film etching step was performed. The amorphous carbon film etching step, the first silicon oxide film etching step and the second silicon oxide film etching step were carried out under the same conditions as in Comparative Example 1. The amorphous carbon film modifying step was performed under the following conditions.

(Amorphous Carbon Film Modifying Step)

Processing gas flow ratio: COS/$CF_4$/Ar=20:30:800

Pressure: 6.7 Pa (50 mTorr)

High frequency power from the first high frequency power supply: 300 W

High frequency power from the second high frequency power supply: 0 W

DC voltage to the upper electrode: −900 V

Example 2

In the amorphous carbon film modifying step, a processing gas and a processing gas flow ratio shown below were used. The other conditions are the same as in Example 1.

Example 2

$H_2$/Ar=100:800

Figure 6:
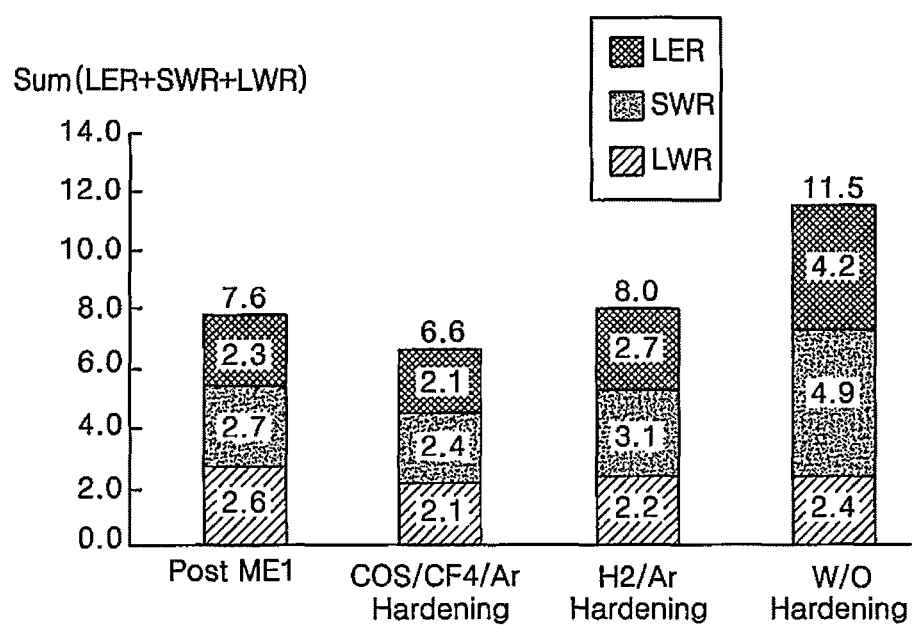
FIG. 6 is a diagram showing the processing results in Comparative Example 1, Example 1 and Example 2.

FIGS. 5 and 6 are diagrams showing the processing results in Comparative Example 1, Example 1 and Example 2. In FIG. 5, "Post ME1" indicates the target object after performing the first silicon oxide film etching step in Comparative Example 1 and Example 1. Further, "COS/$CF_4$/Ar Hardening" indicates the target object after performing the second silicon oxide film etching step in Example 1, and "$H_2$/Ar Hardening" indicates the target object after performing the second silicon oxide film etching step in Example 2. Furthermore, "w/o Hardening" refers to the target object after performing the second silicon oxide film etching step in Comparative Example 1. In FIG. 5, "cross-section" and "upper surface" are trace diagrams of photographs obtained by expanding the cross-section and the upper surface of the target object, respectively.

Further, FIGS. 5 and 6 show line width roughness (LWR), space width roughness (SWR), line edge roughness (LER) and "Sum" that is the sum of the LWR, SWR and LER. The LWR, SWR, LER and Sum indicate the degree of non-uniformity of the lines, respectively. Also, FIG. 5 shows "Top CD" indicating critical dimension (CD) of the bottom portion of the amorphous carbon film, i.e., the CD of the top portion of the silicon oxide film.

As shown in FIGS. 5 and 6, as compared with Comparative Example 1 that does not include the amorphous carbon film modifying step, in Examples 1 and 2 in which the amorphous carbon film modifying step was performed, the LWR, SWR, LER and Sum were smaller. In other words, in Examples 1 and 2, as compared with Comparative Example 1, wiggling of lines formed by etching was suppressed. Also, in Examples 1 and 2 in which the amorphous carbon film modifying step was performed, the cross-sectional shape of lines formed after performing the second silicon oxide film etching step was maintained in a rectangular shape.

Further, as shown in FIG. 5, as compared with Comparative Example 1 that does not include the amorphous carbon film modifying step, in Examples 1 and 2 in which the amorphous carbon film modifying step was performed, the Top CD was reduced. In other words, in Examples 1 and 2, as compared with Comparative Example 1, an effect (CD shrink effect) of suppressing the expansion of Top CD was increased.

Thus, by performing the etching step after the amorphous carbon film modifying step, it is possible to reduce the roughness of the amorphous carbon film serving as a mask to improve the cross-sectional shape. In other words, it is possible to etch the silicon oxide film while maintaining the amorphous carbon film serving as a mask in an appropriate state. Also, it is possible to suppress the wiggling while improving the LWR and the like. As a result, even if the etching step is continuously performed, when performing the etching step after the amorphous carbon film modifying step, the roughness of the etching shape is suppressed and clean etching can be achieved as compared with a case in which the amorphous carbon film modifying step is not performed.

While the invention has been shown and described with respect to the embodiments, it will be understood by those skilled in the art that various changes and modification may be made without departing from the scope of the invention as defined in the following claims.

What is claimed is:

1. A plasma etching method comprising:
   etching an amorphous carbon film by a plasma of an oxygen-containing gas using, as a mask, an SiON film having a predetermined pattern formed on a target object;
   etching a silicon oxide film by a plasma of a processing gas using the etched amorphous carbon film as a mask while removing the SiON film remaining on the etched amorphous carbon film by the plasma of the processing gas;
   modifying the etched amorphous carbon film by a plasma of a sulfur-containing gas or a hydrogen-containing gas while applying a negative DC voltage to an upper electrode containing silicon after the SiON film is removed from the etched amorphous carbon film; and
   etching the silicon oxide film by the plasma of the processing gas using the modified amorphous carbon film as a mask.

2. The plasma etching method of claim 1, wherein the processing gas is a CF-based gas or a gaseous mixture of the CF-based gas and a CHF-based gas.

3. The plasma etching method of claim 1, wherein the oxygen-containing gas is $O_2$ gas, a gaseous mixture of COS and $O_2$, or a gaseous mixture of CO and $O_2$.

4. The plasma etching method of claim 2, wherein the CF-based gas is a gaseous mixture of $C_4F_6$, Ar and $O_2$ or a gaseous mixture of $C_4F_8$, Ar and $O_2$.

5. The plasma etching method of claim 2, wherein the gaseous mixture of the CF-based gas and the CHF-based gas is a gaseous mixture of $C_4F_8$, $CHF_3$, Ar, and $O_2$, a gaseous mixture of $CF_4$, $CHF_3$, Ar, and $O_2$, or a gaseous mixture of $CF_4$, $CH_2F_2$, Ar, and $O_2$.

6. The plasma etching method of claim 1, wherein the sulfur-containing gas is a gaseous mixture of COS, $CF_4$, and Ar, and the hydrogen-containing gas is a gaseous mixture of $H_2$ and Ar.

7. A plasma etching method comprising:
etching an amorphous carbon film by a plasma of an oxygen-containing gas using, as a mask, an SiON film having a predetermined pattern formed on a target object;
etching a first silicon oxide film by a plasma of a first processing gas using the etched amorphous carbon film as a mask while removing the SiON film remaining on the etched amorphous carbon film;
modifying the etched amorphous carbon film by a plasma of a sulfur-containing gas or a hydrogen-containing gas to form a modified amorphous carbon film while applying a negative DC voltage to an electrode containing silicon; and
etching a second silicon oxide film by a plasma of a second processing gas using the modified amorphous carbon film as a mask.

8. The plasma etching method of claim 7, wherein at least one of the first processing gas and the second processing gas is a CF-based gas or a gaseous mixture of the CF-based gas and a CHF-based gas.

9. The plasma etching method of claim 7, wherein the oxygen-containing gas is $O_2$ gas, a gaseous mixture of COS and $O_2$, or a gaseous mixture of CO and $O_2$.

10. The plasma etching method of claim 8, wherein the CF-based gas is a gaseous mixture of $C_4F_6$, Ar and $O_2$ or a gaseous mixture of $C_4F_8$, Ar and $O_2$.

11. The plasma etching method of claim 8, wherein the gaseous mixture of the CF-based gas and the CHF-based gas is a gaseous mixture of $C_4F_8$, $CHF_3$, Ar, and $O_2$, a gaseous mixture of $CF_4$, $CHF_3$, Ar, and $O_2$, or a gaseous mixture of $CF_4$, $CH_2F_2$, Ar, and $O_2$.

12. The plasma etching method of claim 7, wherein the sulfur-containing gas is a gaseous mixture of COS, $CF_4$, and Ar, and the hydrogen-containing gas is a gaseous mixture of $H_2$ and Ar.

13. The plasma etching method of claim 7, wherein the modified amorphous carbon film contains a CS-based material or a Si-containing material.

14. The plasma etching method of claim 7, wherein said etching the amorphous carbon film comprises leaving the SiON film on the amorphous carbon film and exposing the first silicon oxide film.

* * * * *